United States Patent
Kawai et al.

(10) Patent No.: US 7,034,454 B2
(45) Date of Patent: Apr. 25, 2006

(54) ORGANIC LIGHT EMITTING DEVICE WITH REVERSE INTERSYSTEM CROSSING LIGHT EMITTING MOLECULES

(75) Inventors: Tatsundo Kawai, Kanagawa (JP); Koichi Suzuki, Kanagawa (JP); Hiroshi Tanabe, Kanagawa (JP); Keiji Okinaka, Kanagawa (JP); Naoki Yamada, Tokyo (JP); Chika Negishi, Kanagawa (JP); Akihito Saito, Kanagawa (JP); Maki Okajima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 124 days.

(21) Appl. No.: 10/733,294

(22) Filed: Dec. 12, 2003

(65) Prior Publication Data

US 2004/0150327 A1     Aug. 5, 2004

(30) Foreign Application Priority Data

Dec. 16, 2002  (JP)  ............................ 2002-363283
Dec. 8, 2003   (JP)  ............................ 2003-408493

(51) Int. Cl.
     *H05B 33/00* (2006.01)
(52) U.S. Cl. ...................... 313/504; 428/690
(58) Field of Classification Search ............... 313/504, 313/506; 428/690, 917
     See application file for complete search history.

(56) References Cited

U.S. PATENT DOCUMENTS

| | | | |
|---|---|---|---|
| 6,652,997 B1 | 11/2003 | Suzuki et al. | 428/690 |
| 2002/0146589 A1 | 10/2002 | Akiyama et al. | 428/690 |
| 2003/0235713 A1 | 12/2003 | Suzuki et al. | 428/690 |

FOREIGN PATENT DOCUMENTS

JP     2002-50483     2/2002

OTHER PUBLICATIONS

C.W. Tang, et al., "Organic Electroluminescent Diodes", Appl. Phys. Lett., vol. 51, pp. 913-915 (1987), (no month).
J.H. Burroughes, et al., "Light-Emitting Diodes Based on Conjugated Polymers", Nature, vol. 347, pp. 539-541 (1990), (no month).

(Continued)

*Primary Examiner*—Joseph Williams
(74) *Attorney, Agent, or Firm*—Fitzpatrick, Cella, Harper & Scinto

(57) ABSTRACT

There is provided an organic light emitting device to break through the limit of 25% of internal quantum efficiency and 5% of external quantum efficiency while using singlet luminescence. Specifically provided is an organic light emitting device comprising an anode, an organic layer and a cathode, wherein light-emitting molecules present in an emissive layer which is at least a part of the organic layer and responsible for luminescence by charge injection effect transition from a triplet excited state having an energy level higher than a lowest excited singlet state to a singlet excited state and effect fluorescent emission in a fluorescence quantum yield of 60% or more in the same state as existing in the emissive layer, and wherein the emissive layer comprises the light-emitting molecules as a main component in an amount of 50 wt % or more, or is doped with the light-emitting molecules at a high concentration of 7 wt % or more, or is a layer in which the light-emitting molecules are excitable by direct trapping of electrons and holes has enabled to break through the limit of 25% of internal quantum efficiency and 5% of external quantum efficiency while using singlet luminescence.

7 Claims, 4 Drawing Sheets

OTHER PUBLICATIONS

M.A. Baldo, et al., "Very High-Efficiency Green Organic Light-Emitting Devices Based on Electrophosphorescence", Appl. Phys. Lett., vol. 75, pp. 4-6 (1999), (no month).

H. Fukumura, et al, "Temperature Effect on Inverse Intersystem Crossing of Anthracenes", J. Photochemistry and Photobiology, vol. 42, pp. 283-291 (1988), (no month).

N.J. Turro, Modern Molecular Photochemistry, University Science Books, Mill Valley, California, chapter 6, sections 6.9-6.10, pp. 185-189 (1991), (no month).

T. Tsutsui, et al., "Evaluation of True Power Luminous Efficiency from Experimental Luminance Values", Jpn. J. Appl. Phys., vol. 38, pp. 2799-2803 (1999), (no month).

M.P. Cava, et al., "A Simple Synthetic Route to Benzo[c]thiophene and the Naphtho[c]thiophenes", J. Org. Chem., vol. 36, pp. 3932-3937 (1971), (no month).

C. Adachi, et al., "Efficient Electrophosphorescence Using a Doped Ambipolar Conductive Molecular Organic Thin Film", Organic Electronics, vol. 2, pp. 37-43 (2001), (no month).

ORGANIC LIGHT EMITTING DEVICE WITH REVERSE INTERSYSTEM CROSSING LIGHT EMITTING MOLECULES

BACKGROUND OF THE INVENTION

1. Field of the Invention

The present invention relates to a charge injection type light emitting device, and more particularly to an organic, charge injection type light emitting device having an organic active layer.

2. Related Background Art

An organic light emitting device is a device in which a thin film containing a fluorescent organic compound is interposed between an anode and a cathode; excitons of the fluorescent compound are generated by injection of electrons and holes from the electrodes and a light radiated when the excitons return to the ground state is utilized.

In a research by Eastman Kodak Company in 1987 (Appl. Phys. Lett. 51, 913 (1987)), there was reported a light emission of about 1,000 cd/m$^2$ at an applied voltage of about 10 V for a device of functionally separated two-layer structure using ITO for an anode and a magnesium/silver alloy for a cathode, respectively, an aluminum-quinolinol complex as an electron transporting material and a light emitting material and a triphenylamine derivative as a hole transporting material.

In addition, light emission of from ultraviolet region to infrared region is possible by changing the type of the fluorescent organic compound and researches of various compounds have been conducted actively recently.

Moreover, other than the organic light emitting device using the low-molecular materials as described above, a group of Cambridge University has reported an organic light emitting device using a conjugated polymer (Nature, 347, 539 (1990)). In this report, light emission in a monolayer is confirmed by forming a film of polyphenylenevinylene (PPV) in a coating system.

Thus, recent progress in organic light emitting devices is remarkable, and possibilities for a wide range of applications are indicated since it is characterized in that a thin and lightweight light emitting device having a high luminance at a low applied-voltage, diversity of light emitting wavelength and high-speed response can be prepared.

However, a higher-luminance or higher conversion efficiency light output is required under present circumstances.

Conventional organic light emitting devices, in the case of using luminescence by charge injection excitation, have been said to have an upper limit of 25% on the internal quantum efficiency. Considering the loss by internal reflection at the interface of the transparent substrate of the device and air, this value is considered to be equivalent to 5% as external quantum efficiency. Although singlet excited states and triplet excited states of light-emitting molecules arise at random in the case of charge injection excitation, the singlet excited states and triplet excited states are supposed to be generated at a ratio of 1:3 considering that the multiplicity of singlet excited state is 1 while the multiplicity of triplet excited state is 3. Since the ground state is a singlet state in common molecules, the triplet excited state has a very small probability to effect transition to the ground state and therefore does not contribute to luminescence at ordinary temperature. For this reason, it has been said that the upper limit of internal quantum efficiency will be 25% even if all the singlet excited states effect transition.

Recently, in an attempt to overcome this limit, a material has been proposed which utilizes the heavy atom effect and remarkably increases the transition probability from the triplet excited state to the ground state and thereby enables triplet luminescence of a sufficiently high efficiency even at room temperature. M. A. Baldo et al. reported that use of an organic iridium complex as a light-emitting molecule (or emissive molecule) which shows efficient phosphorescence luminescence from the triplet excited state leads to 8.0% of external quantum efficiency (equivalent to about 40.0% of internal quantum efficiency)(Reference 1: Baldo M. A., Lamansky S., Burrows P. E., Thompson M. E., Forrest S. R., "Very high-efficiency green organic light emitting devices based on electrophosphorescence", Appl. Phys. Lett., vol. 75, No. 1, pp 4–6 (1999).

Although searches for materials that exhibit efficient phosphorescence luminescence using the heavy atom effect have been performed actively thereafter, many of the materials other than iridium complex have a problem in respect of efficiency, stability, etc. and, at present, there is no material of which practical use is in prospect. Meanwhile, iridium complex that uses iridium, relatively rare element, is expensive and has a problem from an economical point of view. Furthermore, although the luminescence is efficient, it is phosphorescence luminescence and has a difficulty that when it comes to a high luminance range, triplet—triplet annihilation will occur and the light-emitting quantum efficiency falls. Moreover, design flexibility in terms of luminescence color is also restricted due to the limitation by an iridium complex.

Particularly from this viewpoint of increasing design flexibility of luminescence color, there has been suggested that a singlet luminescent material is allowed to coexist in an emissive layer in combination with an iridium complex so as to make use of energy transfer from the iridium complex to effect light emission of the singlet luminescent material (Reference 2: Japanese Patent Application Laid-Open No. 2002-50483). In this suggestion, a singlet luminescent material to be combined with the iridium complex is said to be selected from materials which are easy to effect reverse intersystem crossing, that is, intersystem crossing from a triplet excited state to a singlet excited state, in order to carry out energy transfer efficiently from the triplet excited state of the iridium complex.

In spite of such an effort, however, the fact that an iridium complex is used remains unchanged, and therefore, disadvantages associated with expensiveness of an iridium complex and triplet—triplet annihilation which leads to a low luminescence efficiency in the high luminance range, are not solved.

SUMMARY OF THE INVENTION

It is, therefore, an object of the present invention to provide an organic light emitting device that breaks through the limit of 25% of internal quantum efficiency and 5% of external quantum efficiency while using singlet luminescence.

According to the present invention, there is provided an organic light emitting device comprising an anode, an organic layer and a cathode, wherein light-emitting molecules present in an emissive layer which is at least a part of the organic layer and responsible for luminescence by charge injection effect transition from a triplet excited state having an energy level higher than the lowest excited singlet state to a singlet excited state and effect fluorescent emission in a fluorescence quantum yield of 60% or more in the same state as existing in the emissive layer, and wherein the emissive layer comprises the light-emitting molecules as a main component in an amount of 50% by weight (hereinafter referred to as "wt %") or more, or is doped with the light-emitting molecules at a high concentration of 7 wt % or more, or is a layer in which the light-emitting molecules are excitable by direct trapping of electrons and holes.

DESCRIPTION OF THE PREFERRED EMBODIMENTS

Figure 1:
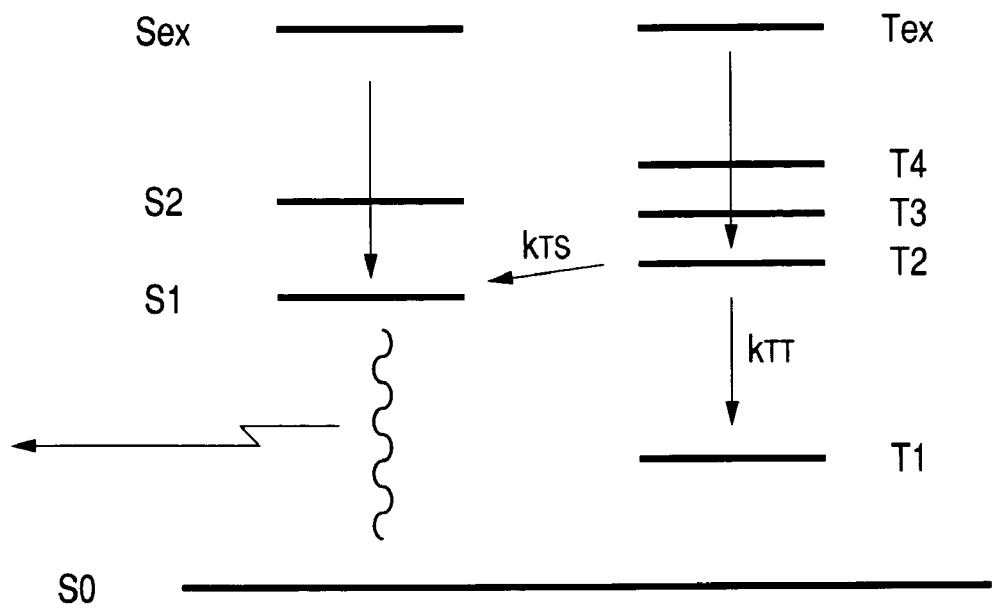
FIG. 1 is an energy diagram of the excited states of the light-emitting molecule used for the organic light emitting device of this invention.

In consideration of the problems of the conventional organic light emitting device, the present inventors have conducted an intensive study in search for an organic light emitting device based on a new luminescence mechanism which, in spite of using singlet luminescence wherein high luminescence efficiency is expectable in a high luminance range as well, enables to break through the limit of 25% of internal quantum efficiency and 5% of external quantum efficiency which were conventionally assumed by a widely held theory. As a result, the present inventors have found that a more positive utilization of the special phenomenon of the above-mentioned reverse intersystem crossing while considering the characteristics suitable for the organic light emitting device, a type of solid light emitting device which is capable of charge injection excitation will lead to means for realizing an organic light emitting device beyond the limit of 25% of internal quantum efficiency and 5% of external quantum efficiency even by using singlet luminescence and without an expensive element like Ir.

The present inventors have also found design criteria for designing light-emitting molecules suitable for the purpose.

That is to say, the present invention is to provide an organic light emitting device which comprises at least an anode, an organic layer which has a luminescence function and a cathode, characterized in that the organic layer consists of molecules which effect transition from a triplet excited state having an energy level higher than the lowest excited singlet state to a singlet excited state, or comprises such molecules at least as a component thereof to thereby solve the above-mentioned problems.

Furthermore, the present invention is to provide an organic light emitting device which comprises at least an anode, an organic layer which has a luminescence function and a cathode, characterized in that molecules constituting or contained in the organic layer effect transition from a triplet excited state having an energy level higher than the lowest excited singlet state to a singlet excited state in the state when existing in the organic layer to thereby solve the above-mentioned problems.

Furthermore, the present invention is to provide an organic light emitting device which comprises at least an anode, an organic layer which has a luminescence function and a cathode, characterized in that molecules constituting or contained in the organic layer effect transition from a triplet excited state having an energy level higher than the lowest excited singlet state to a singlet excited state in the state when existing in the organic layer and that the fluorescence quantum yield thereof is 60% or more, to thereby solve the above-mentioned problems.

Hereinafter, the organic light emitting device of this invention will be described in detail.

First, the phenomenon called reverse intersystem crossing will be explained.

1) Principle of Reverse Intersystem Crossing

Upon reviewing the conventional arguments discussing the upper limit of the internal quantum efficiency in the case of charge injection excitation luminescence using singlet luminescence, one will notice that one assumption has been placed, that is, an assumption that singlet excited states and triplet excited states generated in the ratio of 1:3 are respectively deactivated to the lowest excited singlet state S1 and the lowest excited triplet state T1 while maintaining the spin states unchanged and subsequently radiatively or non-radiatively transit to the ground state. This assumption known as so-called Kasha's Rule is actually applicable in many cases. As mentioned above, however, a possibility is known for some cases that the generated triplet excited state may transit to a singlet excited state in the process of deactivation toward the lowest excited triplet state T1. This phenomenon is referred to as reverse intersystem crossing and although fundamental researches have been limitedly conducted, this phenomenon has been assumed as an exceptional phenomenon and attracted little attention in research and development of an organic light emitting device. The present inventors paid attention to this mechanism and added an improvement thereto so as to make it adapted to the characteristics of the organic light emitting device, a type of solid light emitting device capable of charge injection excitation, and effected an application thereof in a molecule for forming an organic emissive layer or to be contained in an organic emissive layer of an organic light emitting device, and thereby devised an organic light emitting device beyond the conventionally assumed limit and having an internal quantum efficiency above 25% or external quantum efficiency above 5%, in spite of utilizing charge injection excitation luminescence using singlet emission.

Figure 2:
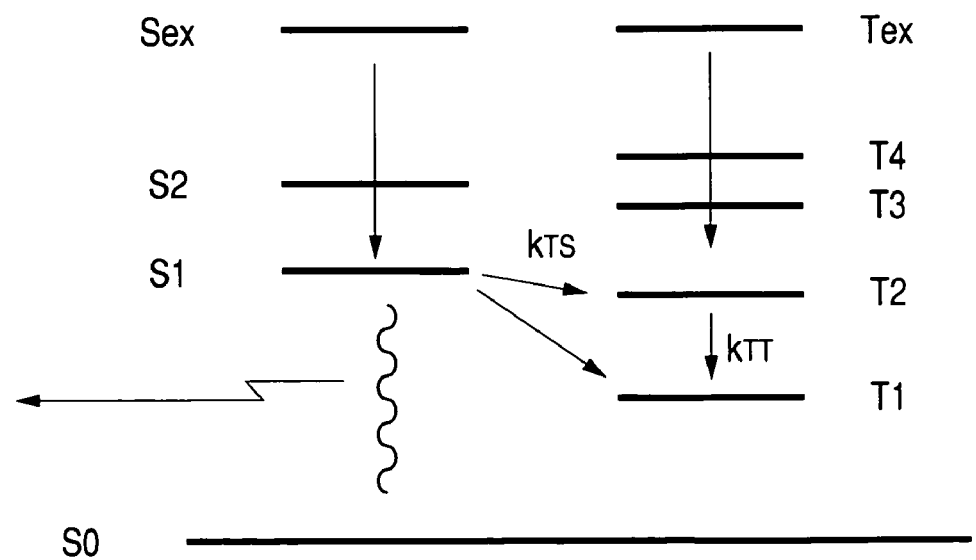
FIG. 2 is an energy diagram of the excited states of a commonly used light-emitting molecule where Kasha's Rule can be applied.
Figure 3:
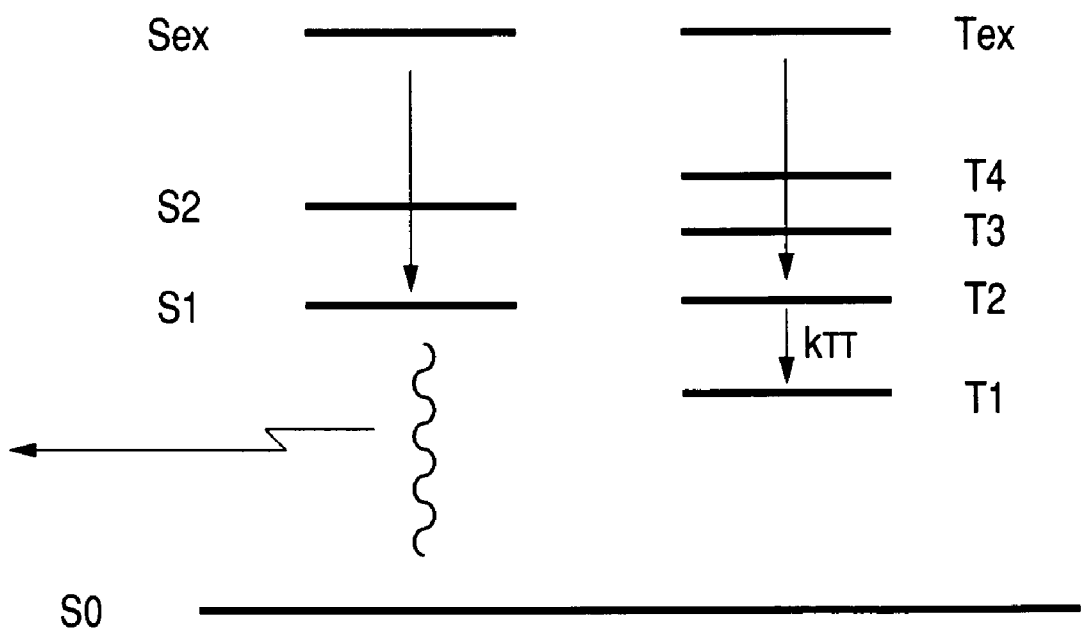
FIG. 3 is an energy diagram of the excited states of a commonly used light-emitting molecule where Kasha's Rule can be applied.

FIG. 1 is an energy diagram of the excited states of the light-emitting molecule used for the organic light emitting device of this invention. FIG. 2 and FIG. 3 are energy diagrams of the excited states of a commonly used light-emitting molecule to which Kasha's Rule can be applied.

In FIG. 1, S1 and S2 respectively represent the energy levels of the lowest excited singlet state and second-lowest excited singlet state, and T1, T2, T3, and T4 respectively represent the energy levels of the lowest excited triplet state, second-lowest excited triplet state, third-lowest excited triplet state, and forth-lowest excited triplet state. Sex and Tex respectively represent the energy levels of the singlet excited state and triplet excited state when being excited with charge injection excitation at a first time. The same designations are used in FIG. 2 and FIG. 3.

Referring to FIG. 2, molecules excited to Sex and Tex levels by charge injection will be non-radiatively deactivated to the lowest excited states S1 and T1 while maintaining the respective spin states, and subsequently the S1 state will be stochastically deactivated to the ground state S0 either through the radiative transition pathway R or non-radiative transition pathway IC. Simultaneously, spin-orbital interaction effect will cause a part of S1 to transit through the intersystem crossing path ISC to the triplet excited state close to S1 in energy level (T2 in the case of this figure) followed by deactivation to the lowest excited triplet state T1. Although T1 state will also transit to the ground state S0, since T1 and S0 have different spin states, radiative transition thereof proceeds very slowly and non-radiative transition becomes superior and accordingly it does not usually contribute to luminescence under the condition of room temperature.

The same applies to the molecule of FIG. 3 but a triplet excited state T2 close to S1 in energy level is higher than S1 in energy level in this case, and thus transition from S1 to the triplet excited state through the path ISC (intersystem crossing) will hardly occur. Therefore, luminescence efficiency higher than the molecule of FIG. 2 can be expected. However, as to the excited states at Sex and Tex levels resulted from charge injection excitation, Sex is a single state while Tex is a triple degenerated state, and therefore state density of these excited states is 1:3 meaning that Sex level excited state is produced in only 25%. Therefore, even if all of S1 transit to S0 by radiative transitions, the resulted light-emitting quantum efficiency does not exceed 25%.

On the other hand, T2 in the molecule of FIG. 1 of this invention which is a triplet excited state and close to the lowest excited singlet state S1 in energy level is higher than S1 in energy level, and at the same time, the energy gap between T2 and the triplet excited state T1 immediately under T2 is large. Non-radiative deactivation not changing the spin state is referred to as internal conversion, and the theoretical handling reveals that the rate of internal conversion depends exponentially on the energy gap and becomes smaller as the energy gap enlarges provided that the other factors are constant. As to the molecule of FIG. 1, the energy gap between T2 and T1 is so large that non-radiative deactivation from T2 to T1 proceeds remarkably slowly. Therefore, contrary to the case of FIG. 2, the reverse intersystem crossing associated with transition from T2 to S1 through the path of the intersystem crossing ISC arises. Consequently, although the Sex level excited state is generated only in a ratio of 25% when charge injection excitation is carried out, S1 level excited state exceeds 25%. Therefore, if radiative transitions arise from S1 to S0 in high probability, the resulted light-emitting quantum efficiency will exceed 25%.

Although the reverse intersystem crossing has been described as occurring between the second-lowest excited triplet state T2 and the lowest excited singlet state S1 in these examples, it is not necessarily limited thereto. The reverse intersystem crossing can occur between a singlet excited state Sn higher than the lowest excited singlet state S1 in energy level and a triplet excited state Tm close to it and a little higher in energy level.

In addition, fluorescent emission has been assumed to occur in the transition from the lowest excited singlet state S1 to the ground state S0, but in fact some molecules effect the transitions from the other singlet excited state. A well-known example is azulene (formula below) that emits light by transition from the second-lowest excited singlet state to the ground state.

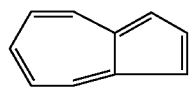

In such a case, reverse intersystem crossing may take place not between "the lowest excited singlet state S1 or a singlet excited state Sn higher than S1 in energy level" and a triplet excited state Tk close to and a little higher than it in energy level but between "a singlet excited state Si which generates luminescence or singlet excited state Sj higher than it in energy level" and Tk.

As to the reverse intersystem crossing, as mentioned above, fundamental studies have been conventionally conducted and an application thereof to an organic light emitting device was limitedly conceived. These fundamental studies were, however, focused on molecules having a relatively small molecular weight or on the mechanism relating to a newly found reverse intersystem crossing in an existing fluorescence molecule, and no such a research as positively designing a new molecule which is easy to effect reverse intersystem crossing has been conducted. The application to an organic light emitting device was also such an application that uses an existing fluorescence molecule in which reverse intersystem crossing were known and allows it to be contained as it is in the emissive layer of an organic light emitting device, and was not designing a novel molecule adapted to the characteristics of an organic light emitting device.

If it is aimed at to obtain efficient luminescence using an organic light emitting device and to exceed the conventional limit, the object is difficult to attain only by having an existing molecule in which reverse intersystem crossing occurs contained as a light-emitting molecule in an organic light emitting device. Light-emitting molecules must also be provided with sufficiently high fluorescence quantum yield simultaneously. Because, even though there occur singlet excited states at a higher rate by reverse intersystem crossing, if the singlet excited states themselves do not effect fluorescent emission highly efficiently, the luminescence efficiency as an organic light emitting device does not increase after all. Although fluorescence molecules generally emit fluorescence at a high light-emitting quantum efficiency in a diluted solution, the light-emitting quantum efficiency occasionally falls in such a condition as in a solution of increased concentration or in a solid state such as powders or a thin film. In these cases, it is common that a shift in luminescence wavelength, especially to longer wavelength occurs concurrently. This is because fluorescence molecules are associated with each other in a solid state, and the rate of the radiative and non-radiative transitions from an excited state or the energy of the excited states are changed.

For example, Nile Red and Rhodamine 101 and the like, fluorescent dye which are described as reverse intersystem crossing substances in Reference 2 exhibit an efficient fluorescent emission in the state of a diluted solution, but this fluorescence quantum yield falls in the state of a powder or a thin film.

In order to avoid this phenomenon, there is a method wherein a matrix is formed of another molecule that will not readily interact with the fluorescence molecule and the fluorescence molecule is molecularly dispersed therein. The working examples of Reference 2 uses a mixed matrix of hole transporting material poly (N-vinyl carbazole) and PBD in which a very small amount (weight ratio: about 0.5 wt %) of Rhodamine 101 or Nile Red, fluorescence molecules, is dispersed.

For this reason, it is difficult in the working examples of reference 2 to recombine the injected electric charges directly on the molecules which effect reverse intersystem crossing and instead a roundabout method is taken which comprises conducting the recombination on an iridium complex, and making energy transfer from the triplet excited state of the iridium complex to the triplet excited state of the fluorescence molecule, and accordingly an iridium complex was needed after all and the resulted luminescence luminance was not high for a high voltage applied.

In order that the effect of reverse intersystem crossing may be utilized efficiently so that efficient luminescence may be achieved as an actual organic light emitting device, the excited state caused by the recombination of hole and electron which have been injected into the organic light emitting device needs to be efficiently transitioned from a triplet excited state to a single excited state on the molecule which effects reverse intersystem crossing.

For that purpose, it is desirable that the molecule which effects this reverse intersystem crossing is excited not by excited state energy transfer from the other excited molecules (for example, energy transfer through the mechanisms called Foerster transition or Dexter transition) but by carrier transfer of an electron or an hole from a proximate molecule. Hereinafter, such excitation is referred to as excitation by direct trapping of carrier.

Accordingly, film constitution in the organic light emitting device should be also suitable for the purpose. Most typically, an emissive layer is provided as a layer formed of molecules that effect the reverse intersystem crossing of the present invention as a main component. That is, they are used as a single emissive layer material or an emissive layer host material. As long as the emissive layer is mostly formed of or contains 50 wt % or more of the molecule that effects reverse intersystem, it can be said that it uses as a single luminescent material or an emissive layer host material. When such a molecule is used as an emissive layer guest material, the concentration thereof needs to be high enough so that the reverse intersystem crossing material of the present invention can directly trap the carrier injected into the emissive layer. The concentration at which the direct trap will be caused depends on the host material and the guest material. For example, when an Ir complex is used as an emissive layer guest material such as a conventional phosphorescence light emitting device comprising CBP as a host and Ir(ppy)$_3$ dispersed therein as a guest, the direct trapping occurred at 7% of Ir(ppy)$_3$ concentration. (Reference 3: Adachi C., Kwong R., Forrest S. R., "Efficient electrophosphorescence using a doped ambipolar conductive molecular organic thin film", Organic Electronics, 2 (2001), pp 37–43). Considering this, when the molecule that effects the reverse intersystem crossing of the present invention is used as a guest, it may be desirable that the concentration thereof is 7% or more.

Whether the direct trapping occurs or not should preferably be determined through examination procedure as disclosed in the above-mentioned Reference 3 but conveniently it can be achieved by preparing an organic light emitting device with similar composition except that the emissive layer does not comprise a molecule which effects reverse intersystem crossing, and just comparing the operating voltages when the same driving voltage is applied. If the operating voltage of the organic light emitting device which contains in an emissive layer the molecule which effects reverse intersystem crossing is lower than the operating voltage of an organic light emitting device which does not contain such a molecule, it can be presumed that the molecule which effects reverse intersystem crossing is participating in carrier transportation, and consequently that the direct trapping occurs on the molecule which effects reverse intersystem crossing.

However, many of the materials known to effect reverse intersystem crossing conventionally cannot have sufficiently high fluorescence quantum yield when they are used as a single emissive layer material or an emissive layer matrix material.

Moreover, such a material, even as a guest material, cannot have sufficiently high fluorescence quantum yield when used in high concentration.

Accordingly, it is necessary to design a novel molecule which effects reverse intersystem crossing and exhibits high fluorescence quantum yield also in a solid state.

For this reason, some considerations were conducted.

2) Optimal Condition for Reverse Intersystem Crossing 2-1) T1–T2 Gap

How much energy gap between T2 and T1 is necessary to arise such an effect cannot be generally stated since there are other factors than energy gap that determine the rate. However, researches have been made about some molecules. For example the case of anthracene and its derivative was studied in detail (Reference 4: FUKUMURA H., KIKUCHI K., KOIKE K., KOKUBUN H., Journal of Photochemistry and Photobiology, A: Chemistry, 42 (1988) 283–291). This research experimentally determined the level of S1, T1 and T2 in a solution state for each molecule. The results of this research are shown in Table 1.

TABLE 1

|  | $\Phi_{TS}$(at 298K) | $A_{TS}/k_{TT}$ or $K_{TS}/k_{TT}$ | $\Delta E(S_1 - T_2)$ [eV] | $\Delta E(T_2 - T_1)$ [eV] | $A_{ST}[s^{-1}]$ | $k_{TT}[s^{-1}]$ |
| --- | --- | --- | --- | --- | --- | --- |
| Anthracene | $2.6 \times 10^{-5}$ | $7.2 \times 10^{-4}$ | 0.0539 | 1.393 | $3.4 \times 10^{-9}$ | $4.7 \times 10^{-12}$ |
| 1.5-DCA | $2.6 \times 10^{-4}$ | $1.5 \times 10^{-3}$ | 0.074 | 1.302 | $1.5 \times 10^{-9}$ | $1.0 \times 10^{-11}$ |
| 9-MA | $3.6 \times 10^{-4}$ | $3.6 \times 10^{-4}$ | −0.084 | 1.401 | $4.9 \times 10^{-9}$ | $1.4 \times 10^{-13}$ |
| 9.10-DCA | $1.5 \times 10^{-2}$ | $1.5 \times 10^{-2}$ | −0.167 | 1.494 | $7.2 \times 10^{-10}$ | $4.8 \times 10^{-12}$ |
| 9.10-DBA | $1.8 \times 10^{-1}$ | $2.3 \times 10^{-1}$ | −0.172 | 1.485 | $9.1 \times 10^{-11}$ | $4.0 \times 10^{-12}$ |

The readiness of occurring the reverse intersystem crossing depends on the balance of the transition rate from triplet excited state causing reverse intersystem crossing (T2 in the case of anthracenes of this research) to the singlet excited state (S1 in the case of anthracenes of this research) and the transition rate from the triplet excited state causing reverse intersystem crossing (T2 in the case of anthracenes of this research) to the triplet excited state below it (T1 in the case of anthracenes of this research).

Now the transition rate from T2 to T1 is designated as $k_{TT}$ and the transition rate from T2 to S1 as $k_{TS}$.

If $k_{TS}/k_{TT}$ is large, reverse intersystem crossing is considered to readily occur, and if small, reverse intersystem crossing is considered to not readily occur.

According to Reference 4, the value of T2–T1 gap, the transition rate $k_{TT}$ from T2 to T1, the transition rate $k_{TS}$ from T2 to S1 and the coefficient Φts of reverse intersystem crossing from T2 to S1 of anthracene are respectively 11240 $cm^{-1}$ (1.35 eV), 4.7E12 $sec^{-1}$, 3.4E9 $sec^{-1}$, and $2.6\times10^{-5}$.

Although Φts in this condition is still small, the value of T2–T1 gap, the transition rate $k_{TT}$ from T2 to T1, the transition rate $k_{TS}$ from T2 to S1 and the coefficient Φts of reverse intersystem crossing from T2 to S1 of a bromine-substituted anthracene, 9,10-dibromoanthracene (9,10-DBA) are respectively 11980 $cm^{-1}$ (1.49 eV), 4.0E12 $sec^{-1}$, 9.1E11 $sec^{-1}$, and $1.9\times10^{-1}$. Although the value of T2–T1 gap does not change so much, since the intersystem crossing between T2–S1 is accelerated by heavy atom effect by bromine, the transition rate $k_{TS}$ from T2 to S1 becomes larger, and consequently sufficiently large reverse intersystem crossing coefficient Φts is obtained.

2-2) ISC Rate

In order that the reverse intersystem crossing mechanism will function well, there is an approach of increasing the rate of reverse intersystem crossing from T2 to S1 in addition to an approach of decreasing the rate of non-radiative deactivation from T2 to T1. Among the examples in Table 1, anthracene and 1,5-dichloroanthracene (1,5-DCA) indicate S1>T2, meaning that the reverse intersystem crossing from T2 to S1 occurs slowly and $k_{TS}/k_{TT}$ is small. Although indicating S1>T2, 9-MethylAnthracene (9-MA) is a compound consisting only of carbon and hydrogen and has a slow reverse intersystem crossing from T2 to S1 and small $k_{TS}/k_{TT}$. 9,10-dichloroanthracene (9,10-DCA) and 9,10-dibromoanthracene (9,10-DBA) indicating S1<T2 and containing relatively heavy atoms of an atomic number of the 3rd cycle or more in the periodic table like chlorine or bromine exhibit a fast reverse intersystem crossing from T2 to S1, a large value of $k_{TS}/k_{TT}$ and sufficiently large reverse intersystem crossing coefficient Φts is obtained. In this case, unlike phosphorescence luminescent materials containing Ir mentioned in the background art section, sufficient effect is achieved even by an element of an atomic number like bromine.

In order to increase the rate of the reverse intersystem crossing from T2 to S1, S1<T2 is required in the first place.

In the case that T2–T1 gap is fairly larger than 1.3 eV and that the transition rate from T2 to T1 is sufficiently small, or in the case that T2–T1 gap is about 1.3 eV or less but the transition rate from T2 to T1 is sufficiently small due to other factors which contribute to the transition rate from T2 to T1, the condition of S1<T2 may be sufficient to obtain the effect of reverse intersystem crossing to a practically significant extent but an improvement can be further attained by containing a relatively heavy atom of the third cycle or more in the periodic table (i.e. 11 or more in atomic number). This is because the so-called heavy atom effect makes the spin orbital interaction larger and the intersystem crossing rate or reverse intersystem crossing rate between a triplet excited state and a singlet excited state increases. The example of the above-mentioned Reference 4 corresponds to this case.

The rate of reverse intersystem crossing can be further improved by appropriately designing the state of the electron orbitals of T2 excited state and S1 excited state.

The rate of reverse intersystem crossing differs depending upon whether the molecule consists only of relatively light atoms or contains a relatively heavy atom, but besides this, the rate changes in accordance with the states of the electron orbitals of T2 excited state and S1 excited state. As is known well, in the case that the singlet excited state is constituted by ππ* excitation (excitation from a π-conjugate orbital to a π-conjugate orbital) and the triplet state is constituted by nπ* excitation (excitation from an isolated orbital to a π-conjugate orbital) or in the case of reverse combination that triplet excited state is constituted by ππ* excitation, and the singlet state is constituted by nπ* excitation, there is a general rule that the intersystem crossing and the reverse intersystem crossing between those triplet excited states and singlet excited state occurs quickly (El-Sayed's Rule).

In the case of anthracene and its derivatives as mentioned above, all the singlet excited state and triplet excited state are constituted by ππ* excitation and $k_{TS}$ for 9-MethylAnthracene (9-MA) which does not contain a relatively heavy atom like chlorine or bromine is on the order of the 9th power of 10 $[s^{-1}]$.

However, among examples of intersystem crossing between ππ* excitation and nπ* excitation, for example, according to (Reference 5: Turro N. J., "Modern Molecular Photochemistry", University Science Book (1991), pp 186), benzophenone in which the triplet excited state is constituted by ππ* excitation, and the singlet state is constituted by nπ* excitation has an intersystem crossing rate $k_{ST}$ from S1 to T2 on the order of the 11th power of 10 $[s^{-1}]$ although this compound does not contain a relatively heavy atom like chlorine or bromine.

2-3) Numerical Standard

In this way, the rate $k_{ST}$ of reverse intersystem crossing may be improved to the order of the 11th power of 10 $[s^{-1}]$ depending upon the condition of a molecule but in order to improve the light-emitting quantum efficiency of an organic light emitting device to a practically significant extent (reverse intersystem crossing coefficient Φts on the order of $10^{-2}$ or more) by this factor, it is desirable to achieve the rate $k_{TT}$ of internal conversion from T2 to T1 lower than the order of the 13th power of 10 $[s^{-1}]$, and if possible lower than the order of the 11th power of 10 $[s^{-1}]$.

Referring to Table 1 again, $k_{TT}$ of 1,5-dichloroanthracene (1,5-DCA) is exactly the 11th power of $1.0\times10$ $[s^{-1}]$. According to the Reference 4, T2–T1 gap of 1,5-dichloroanthracene (1,5-DCA) is 25040 $[cm^{-1}]$–14540 $[s^{-1}]$=10500 $[s^{-1}]$=1.30 eV.

The rate of internal conversion from T2 to T1 depends on the energy gap as one of the main factors with some variations by the contribution of the other factors. If this is taken into consideration, T2–T1 gap of 1.3 eV or more is one standard for planning a molecular design which practically significantly improves the light-emitting quantum efficiency of an organic light emitting device by the effect of reverse intersystem crossing.

3) Fluorescence Quantum Yield

Now, when the light-emitting quantum efficiency of an organic light emitting device is tried to improve to a practically significant level, particularly so as to achieve an internal quantum efficiency exceeding the conventional theoretical limit, 25%, another important factor is noted.

That is to inhibit non-radiative transitions as much as possible and to induce radiative transitions with a high efficiency in the transitions from S1 to S0. Actually, even if the generation efficiency of S1 is managed to exceed 25% by reverse intersystem crossing, so much non-radiative transition from S1 would result in 25% or less of internal quantum efficiency.

How much value is required for the fluorescence quantum yield? This may be considered from a viewpoint of how to achieve 25% or more of internal quantum efficiency.

First contemplated is an ideal case where reverse intersystem crossing efficiency is 100%, and all the generated excited states will finally be turned to a singlet excited state.

Even in this case, unless the fluorescence quantum yield exceeds a certain value, the internal quantum efficiency will not exceed 25%. It will be readily understood that 25% or more of fluorescence quantum yield is required.

Of course, the higher fluorescence quantum yield is, the more desirable.

Which level is appropriate as a standard in consideration of actually realized reverse intersystem crossing efficiency?

For example, 9,10-dibromoanthracene among the examples of Reference 1 has a largest reverse intersystem crossing quantum efficiency $\Phi$ts $1.9 \times 10^{-1}$. Supposing that the ratio of singlet excited state and triplet excited state is initially 1:3, the ratio of singlet excited state and triplet excited state after reverse intersystem crossing is $1+\Phi$ts·3: $3-\Phi$ts·3. The ratio of singlet excited state over all the excited states will be $(1+\Phi$ts·3$)/(1+\Phi$ts·3$+3-\Phi$ts·3$)=0.3925$.

In order to achieve 25% or more of internal quantum efficiency, the radiative transitions probability from the singlet excited state, i.e., fluorescence quantum yield needs to be $0.25/0.3925=0.6369$, that is 63.69% or more and roughly about 60% or more is required.

There are two non-radiative transition-pathways in the transition from S1 to S0 that must be taken into consideration. One is internal conversion from S1 to S0. Another is a transition path from S1 to a triplet excited state below S1 (typically T1, T2, etc., and T1 for the molecule which satisfies the reverse intersystem crossing condition, S1<T2.) via an intersystem crossing and then from T1 to S0. Quantum efficiency of luminescence in the transition from S1 to S0 depends on the ratio of radiative transition rate and the non-radiative transition rate via the above-mentioned two pathways. Therefore, one factor that increases the quantum efficiency of luminescence in the transition from S1 to S0 is increasing the rate of radiative transitions, and for that purpose increasing the oscillator strength from S1 to S0. Another is decreasing the non-radiative transition rate, which may be effected by, for example, enlarging S1–T1 gap (for example, 0.5 eV or more), and decreasing the rate of intersystem crossing between S1–T1.

Usually, when investigating the proportion of the radiative transitions to the non-radiative transitions from S1 to S0 of a certain molecule, fluorescence quantum yield optically excited in a diluted solution is investigated. Fluorescence quantum yield may vary depending on the type of the solvent in some cases but a high fluorescence quantum yield (for example, 60% or more) obtained for a solution diluted with at least a certain kind of solvent will be a criterion for screening a desirable molecule conveniently.

4) Thin-film Forming Properties

When an application to an organic light emitting device is aimed at, the layer containing the fluorescence molecule that effects reverse intersystem crossing needs to have thin film stability. An organic film formed on a substrate may occasionally effect crystallization and change with time so that the film includes minute unevenness and grain boundaries. Once such changes occur in one of the layers that constitute the organic light emitting device, also tend to occur troubles such as leaking in which injected electrons or holes pass through the organic layer to the other side without recombining with each other or destruction by current. Therefore, the layer containing the fluorescence molecules that effect reverse intersystem crossing is required to be stable as an amorphous state (thin film stability). Particularly in the case of the single emissive layer comprising as the main component the fluorescence molecule which effects reverse intersystem crossing, thin film stability thereof is defined by particular features of this fluorescence molecule.

5) As to State of Existing in OLED Device

When a fluorescence molecule is used as an emissive layer material in an OLED device, the state (or form) in which it exists in an OLED device is generally not a solution state but a solid state like a thin film. Therefore, it is required that the reverse intersystem crossing occurs on the molecule and the fluorescence quantum yield is high in the state in which the molecule is present in the OLED device when actually applied to an OLED device. If this molecule exists in the device and forms a single layer as an emissive layer, it is required that reverse intersystem crossing arises and the fluorescence quantum yield is high within the thin film made only of this molecule. If this molecule exists in the device as a dopant molecularly dispersed in the thin film of a matrix comprising other molecules, it is required that reverse intersystem crossing of the molecule arises and the fluorescence quantum yield is high in the state in which it is dispersed in the matrix of the thin film.

For some molecule, fluorescence quantum yield can be low in a diluted solution, while the fluorescence quantum yield may be high in a solid state. It is conceivable as the cause of this that rotation and vibration of some portions of the molecule become unconstrained in the state of a solution which in turn increases the rate of non-radiative transitions but in addition to this, it is also considered that S1 level or T2 level was influenced by the interaction with a solvent, and the conditions of S1<T2 have dissolved. For example, it is known that anthracene shows such a behavior. Anthracene, whose energy levels of the excited states in a solution state are respectively:

| S1 | 3.3 eV |
| T1 | 1.8 eV |
| T2 | 3.2 eV | meaning that T2 becomes lower than S1, does not fulfill the conditions of S1<T2 but in a crystal state, it exhibits

| S1 | 3.15 eV |
| T1 | 1.84 eV |
| T2 | 3.23 eV and fulfils the conditions of S1 < T2. |

In the state of a solution, the energy level of each excited state is influenced by the interaction with a solvent, and the energy level of each excited state is also influenced by the interaction between molecules in the state of a solid. Although referred to as solid state in general, solid state includes various states and types such as a crystalline state, an amorphous state, or a state of dispersion in the matrix of other molecules, etc. and the manner in which interactions between molecules are received is respectively different.

In the light-emitting molecule which is used for the organic light emitting device of this invention and responsible for luminescence of the organic light emitting device, it is required that reverse intersystem crossing of the molecule arises in the state in which the molecule exists in the OLED device when actually applied to an OLED device.

As above-mentioned, a fluorescence molecule emitting light at a high light-emitting quantum efficiency in the state of a diluted solution may occasionally exhibit decrease in fluorescence quantum yield in a solution of increased concentration, powder or a solid state like a thin film. This phenomenon is referred to as concentration quenching, and in order to prevent this phenomenon, it is effective to incorporate a bulky substituent at least in part of the molecule structure of the fluorescence molecule as a steric hindrance so that the orbitals involved in luminescence of adjacent molecules do not interfere with each other in a solid state.

In the light-emitting molecule which is used for the organic light emitting device of this invention and responsible for luminescence of the organic light emitting device, it is required that the fluorescence quantum yield of the molecule is high in the state in which it exists in the OLED device when actually applied to an OLED device.

6) Carrier Accepting Properties

In order that the molecule which effects reverse intersystem crossing can perform direct trapping of carriers, the molecule itself should have accepting properties to accept both an electron and an hole.

In this viewpoint, a substituent, especially a bulky substituent has desirably a structure containing a double bond moiety at least in part thereof like phenyl group, aryl group such as condensed ring group, heterocyclic ring group, vinyl group or the like rather than a mere alkyl chain or mere alicyclic compound such as adamantane containing no $\pi$ conjugate systems.

7) Molecular Design

As stated above, in order to realize the organic light emitting device beyond the limit of 25% of internal quantum efficiency and 5% of external quantum efficiency by positively using reverse intersystem crossing and considering the characteristic which suits the organic light emitting device, a type of a solid light emitting device capable of charge injection excitation, the light-emitting molecule contained in the organic light emitting device should have as large $k_{TS}/k_{TT}$ value as possible so as to effect the transition from the triplet excited state Tk which has an energy level higher than the lowest excited singlet state to the singlet excited state S1. More generally, taking the transition rate $k_{TTR}$ from Tk to Tk-1 into consideration, it is required that $k_{TS}/(k_{TT}+k_{TTR})$ is as large as possible.

Furthermore, in order that the molecule which is actually responsible for luminescence of an organic light emitting device can realize improvement in luminescence efficiency of an organic light emitting device, luminescence which arises through the transition from a singlet excited states Sl (S1 in many cases) to a lower singlet excited state Sk (S0 in many cases) is required to have a large fluorescence quantum yield. And the large value of the fluorescence quantum yield needs to be obtained in the solid state which is a form used for an actual organic light emitting device.

The condition that $k_{TS}/(k_{TT}+k_{TTR})$ is as large as possible is almost equivalent to:

<1> $k_{TS}$ is as large as possible;

<2> $k_{TT}$ (and $k_{TTR}$) is as small as possible.

Factors that contribute to kTS include a factor resulting from a spin orbital interaction and a factor that comes from the Frank-Condon factor resulting from nuclear vibration. More understandably, it is known that the following conditions will increase $k_{TS}$.

<1> Sl<Tk

<2> Utilizing heavy atom effect of a relatively heavy atom

<3> Utilizing El-Sayed's Rule

In the meantime, factors that contribute to $k_{TT}$ (and $k_{TTR}$) include factors originating from a gap from the so-called Born-Oppenheimer approximation and oscillator strength and a factor that comes from the Frank-Condon factor resulting from nuclear vibration as well. More understandably, it is known that the following conditions will decrease $k_{TT}$ (and $k_{TTR}$).

<4> Gap between Tk–Tk-1 is as large as possible.

<5> Oscillator strength between Tk and Tk-1 is small.

When luminescence arises in the transitions from a singlet excited state Sl (S1 in many cases) to a lower singlet excited states Sk (S0 in many cases) the condition for a large fluorescence quantum yield of this luminescence is <6> Oscillator strength between Sl and Sk is large.

In a solid-state form used for an actual organic light emitting device, the condition for a large fluorescence quantum yield is <7> Concentration quenching is small.

The above will be criteria in molecular designing.

7-1) Calculation Simulation

Some of the energy levels of the excited states such as T1, T2, S1, etc. and the conditions of the electron orbitals of the excited states etc. can be observed but require extraordinary time and effort. In addition, a new molecule to be observed does not exist in designing a new molecule, predicting method other than real observation is needed.

In recent years, rapid progress in computer technology have enabled molecular designing using computer simulations including molecular orbital method, characteristic prediction, various energy state analysis, etc. in the level of practical use.

Accordingly, the present inventors used Gaussian 98, molecular orbital calculation software widely used now, and calculated the energy levels of the ground state and each of the excited states and composition of the excited orbital and the like in the optimized ground state structure approach according to Density Functional Theory and used the results in molecular designing. Calculation for the optimized ground state structure was conducted in DFT, B3LYP functional, and 3-21G* basis. Calculation for the excited states was conducted in TD, B-2LYP functional, and 3-21G* basis. Naturally, this method may contain some errors in terms of calculative accuracy and since the discussion is based only on the optimized ground state structure, it does not give theoretically strictly exact results. However, we confirmed that this calculation gives effective criteria for designing a desirable molecule.

7-2) Conceivable Examples of Particular Molecular Designing Include the Following.

In order to prevent concentration quenching, it is effective to incorporate a bulky substituent at least in part of the molecule structure of the fluorescence molecule as a steric hindrance so that the orbitals involved in luminescence of adjacent molecules do not interfere with each other in a solid state.

The substituent provided as a steric hindrance which contacts directly with an adjoining molecule has desirably not so much population in the orbitals involved with luminescent excitation from a viewpoint that it is not provided for the function of luminescence but mainly for the function of a steric hindrance. That is, a structure comprising a portion which mainly bears the, function of luminescence and a portion which mainly bears the function of a steric hindrance divided on the molecular structure is advantageous in molecular designing.

From this viewpoint, the reverse intersystem crossing properties which effect positively the transitions from a triplet excited state to a singlet excited state and non-concentration quenching properties which show high fluorescence quantum yield even in a condensed condition like a thin film should be combined in a molecule and some molecules have been tentatively designed in order to obtain such a molecule based on a basic concept to provide a molecule having a central backbone which comprises π conjugate system and is responsible for luminescence and a circumference part which has been modified with substitution by a bulky substituent having high steric hindrance properties.

7-2-1) Whole Molecular Structure 7-2-1-1) The whole molecular structure is made to be a structure comprising a central backbone which is responsible for luminescence and substituted by a bulky substituent having high steric hindrance properties (including a structure having such a portion at least in part of the molecule structure, and an oligomer or polymer containing such a unit).

7-2-1-2) Luminescence of the molecule is luminescence from the excited state which includes excitation between the orbitals which have main population in this central backbone (Typically, HOMO and LUMO of the whole molecule have main population in this central backbone and the radiative transition from the lowest excited singlet state to the ground state serves as luminescence of the molecule wherein the lowest excited singlet state is caused by excitation from this HOMO to LUMO.).

7-2-2) Central Backbone 7-2-2-1) In order to lower greatly T1 which is made of excitation between the almost same orbitals to S1 which has luminescence in a visible region, the central backbone is desirably a π conjugated system relatively formed as compact.

7-2-2-2) In order to enlarge T1–T2 gap of the whole molecule, T1–T2 gap at least in the non-substituted central backbone is desirably large (1.3 eV or more).

7-2-2-3) Examples of the central backbone which give large T1–T2 gap includes central backbone structure containing a resonance diene structure of general Formula [I] or General Formula [II].

General Formula [I]

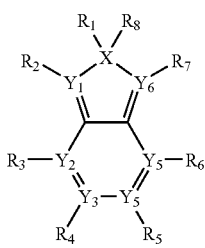

(wherein $Y_1$, $Y_2$, $Y_3$, $Y_4$, $Y_5$ and $Y_6$ represent a carbon atom or a nitrogen atom; $R_1$ and $R_8$ represent no atom, any atom, or any substituent; $R_2$, $R_3$, $R_4$, $R_5$, $R_6$ and $R_7$ represent no atom when directly bonded $Y_1$, $Y_2$, $Y_3$, $Y_4$, $Y_5$ and $Y_6$ are each a nitrogen atom and $R_2$, $R_3$, $R_4$, $R_5$, $R_6$ and $R_7$ represent any atom or any substituent when directly bonded $Y_1$, $Y_2$, $Y_3$, $Y_4$, $Y_5$ and $Y_6$ are each a carbon atom; $R_1$, $R_2$, $R_3$, $R_4$, $R_5$, $R_6$, $R_7$ and $R_8$ may be the same or different or they can be bonded together to form a ring; and X represents an atom of Group III, IV, V or VI of the periodic table.)

General Formula [II]

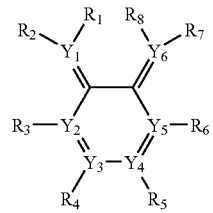

(wherein $Y_1$, $Y_2$, $Y_3$, $Y_4$, $Y_5$ and $Y_6$ represent a carbon atom or a nitrogen atom; $R_1$ and $R_8$ represent any atom or any substituent; $R_2$, $R_3$, $R_4$, $R_5$, $R_6$ and $R_7$ represent no atom when directly bonded $Y_1$, $Y_2$, $Y_3$, $Y_4$, $Y_5$ and $Y_6$ are each a nitrogen atom and $R_2$, $R_3$, $R_4$, $R_5$, $R_6$ and $R_7$ represent any atom or any substituent when directly bonded $Y_1$, $Y_2$, $Y_3$, $Y_4$, $Y_5$ and $Y_6$ are a carbon atom; and $R_1$, $R_2$, $R_3$, $R_4$, $R_5$, $R_6$, $R_7$ and $R_8$ may be the same or different or they can be bonded together to form a ring.)

Specifically, for example, isobenzothiophene (Formula 1-1), isobenzofuran (Formula 1-2), isoindole (Formula 1-3), isobenzosilole (Formula 1-4), isoindene (Formula 1-5), naphthalene (Formula 2-1), 2,3-dihydronaphthalene (Formula 2-2) etc. correspond to these formulas but not limited thereto.

Formula 1-1

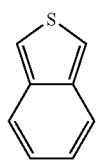

Formula 1-2

Formula 1-3

Formula 1-4

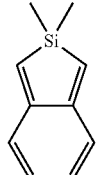

Formula 1-5

Formula 2-1

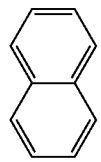

Formula 2-2

Among these, isobenzothiophene (Formula 1-1), isobenzofuran (Formula 1-2), naphthalene (Formula 2-1) and isoindole (Formula 1-3) which have (4n+2) p orbital electrons and form a so-called aromatic ring, and isobenzosilole (Formula 1-4), isoindene (Formula 1-5) and 2,3-dihydronaphthalene (Formula 2-2) which do not form a so-called aromatic ring are different in some situation. The former having a fairly large T1–T2 gap excels in the stability as a molecule as well, while the latter may have still larger T1–T2 gap but many of them have poor stability as a molecule.

7-2-2-4) It is desirable that an element having an atomic number of the 3rd or more periods of the periodic table (11 or more in atomic number) exists in the central backbone or is directly bonded to the central backbone.

7-2-2-5) If substituents and the like can be optimized so that T2 may become nπ* excitation, it may be desirable that an element of Groups V and VI of the periodic table, especially N, O, P and S exist in a central backbone.

When substitution is effected for providing steric hindrance, T1–T2 gap may turn narrower or may be S1=>T2, while only the central backbone itself exhibits sufficiently large T1–T2 gap and S1<T2.

Some molecular designs wherein the molecules have anthracene as a central backbone will be illustrated as examples.

The following is a figure exhibiting anthracene, 9,10-diadamantylanthracene in which the 9- and 10-positions of anthracene are substituted by adamantane, 9,10-diphenylaminoanthracene in which the 9- and 10-positions of anthracene are substituted by diphenylamine, 9,10-di(4-diphenylamino) phenolanthracene in which the 9- and 10-positions of anthracene are substituted by triphenylamine, 9,10-di(9,10-dimetylfluorenone)anthracene in which the 9- and 10-positions of anthracene are substituted by dimetylfluorene, and the structural formulas and energy levels of the singlet excited state and the triplet excited state calculated by computer simulation for each compound.

Anthracene

Anthracene
  LUMO+2:0.2481 eV
  LUMO+1:−0.2728 eV
  LUMO:−1.6571 eV
  HOMO:−5.3477 eV
  HOMO−1:−6.6063 eV
  HOMO−2:−7.0607 eV Anthracene
  S1·HOMO→LUMO . . . 3.4200 eV
  T1·HOMO→LUMO . . . 1.8958 eV
  T2·HOMO−2→LUMO, HOMO→LUMO+2 . . . 3.4267 eV

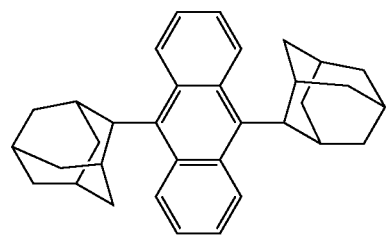

9,10-diadamantylanthracene
  S1·HOMO→LUMO . . . 2.9653 eV
  T1·HOMO→LUMO . . . 1.3113 eV
  T2·HOMO−2→LUMO, HOMO→LUMO+2 . . . 3.3338 eV 9,10-diadamantylanthracene
  LUMO+2:0.4052 eV
  LUMO+1:−0.0251 eV
  LUMO:−1.6360 eV
  HOMO:−4.8248 eV
  HOMO−1:−6.3067 eV
  HOMO−2:−6.6632 eV

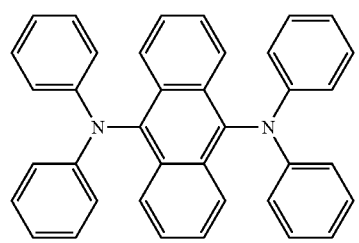

9,10-diphenylaminoanthracene 9,10-diphenylaminoanthracene
S1·HOMO→LUMO . . . 2.5002 eV
T1·HOMO→LUMO . . . 1.6842 eV
T2·HOMO-1→LUMO . . . 2.6190 eV 9,10-diphenylaminoanthracene
LUMO:−1.9211 eV
HOMO:−4.9777 eV
HOMO−1:−5.2905 eV
HOMO−2:−5.7112 eV

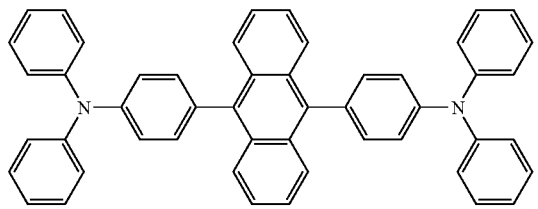

9,10-di(4-diphenylamino)phenolanthracene 9,10-di(4-diphenylamino)phenolanthracene
S1·HOMO→LUMO . . . 2.9693 eV
T1·HOMO→LUMO, HOMO−2→LUMO . . . 1.8059 eV
T2·HOMO-1→LUMO . . . 2.9914 eV 9,10-di(4-diphenylamino)phenolanthracene
LUMO:−1.5683 eV
HOMO:−4.9446 eV
HOMO−1:−5.0656 eV
HOMO−2:−5.2380 eV

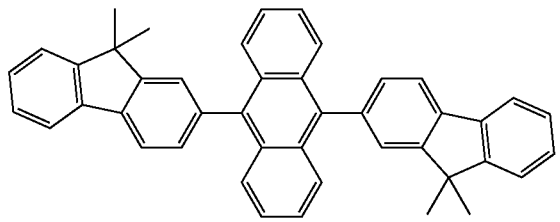

9,10-di(9,10-dimetylfluorenone)anthracene 9,10-di(9,10-dimetylfluorenone)anthracene
S1·HOMO→LUMO . . . 3.308 eV
T1·HOMO→LUMO . . . 1.8361 eV
T2·HOMO−2−LUMO+2, HOMO−1→LUMO+1·3.1586 eV 9,10-di(9,10-dimetylfluorenone)anthracene
LUMO+2:−0.8350 eV
LUMO+1:−0.8470 eV
LUMO:−1.5886 eV
HOMO:−5.1912 eV
HOMO−1:−5.9083 eV
HOMO−2:−5.9162 eV As shown above, even though the molecules have the same central backbone, some molecules in which a bulky substituent has been introduced may exhibit conditions that reverse intersystem crossing cannot take place easily.

This problem is intrinsic to the molecular design which uses reverse intersystem crossing positively and shows that a simple-introduction of a steric hindrance to prevent concentration quenching is insufficient.

For each of the above-mentioned cases, what excitations between which orbitals constitute the excited states of S1, T1, and T2 are examined.

The main excitation that constitutes T1 in these examples is the excitation of HOMO→LUMO while the main excitation that constitutes T2 is the excitation to LUMO from HOMO−1 or HOMO−2. The energy level of T1 or T2 largely depends on the energy difference between the orbitals that constitute the excited state. In fact, anthracene and 9,10-diadamantylanthracene having a large T1–T2 gap among the above-mentioned examples have a large energy difference between HOMO and HOMO−2. 9,10-diphenylaminoanthracene and 9,10-di(4-diphenylamino)phenolanthracene having a small T1–T2 gap have a small energy difference between HOMO and HOMO−1.

7-3) Conditions to Ensure a Large T1–T2 as a Molecule 7-3-1) Even though T1–T2 of the central backbone has 1.3 eV or more, T1–T2 as a molecule may often decrease. What relation does exist between the excited states of the whole molecule having the central backbone with a substituent attached thereto, the original excited state of the central backbone and the excited state of the substituent alone? The answer to this question is desirably known in conducting a molecular design but is difficult to describe as a general rule rather than calculating one by one specifically.

What is relatively easy to consider is a case wherein the π conjugate system of the central backbone and π conjugate system of the substituent is in such a form as indicated below and they are not connected as one π conjugate system, or alternatively the π conjugate system does not exist in the substituent.

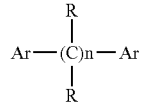

Orbitals such as HOMO, LUMO of the central backbone and orbitals such as HOMO, LUMO of the substituent may most probably compose orbitals of the whole molecule in this case. Although the energy levels of each orbital will somewhat go up and down influenced by each other, they rarely resonate to form a new energy level. If the substituent has T1 at higher level and T2 at lower level compared with a central backbone, T1–T2 gap as whole will become small.

In addition, there is an approach that focuses attention on the energy level of the orbitals in connection with the excited states of T1, T2, and S1 as one standard. In the case of the above-mentioned molecule having anthracene as a central backbone, T1 and S1 are mostly composed of excitations from HOMO to LUMO while T2 is constituted by excitations between the orbits having an energy level near HOMO and LUMO such as the excitation from HOMO−1 or HOMO−2 to LUMO, or from HOMO to LUMO+1 and LUMO+2. And the energy level of T2 becomes higher, as the energy level difference between the orbitals of the excitation that constitutes T2 is larger. In the meantime, the energy level of T1 depends on the energy level difference between the orbitals of excitation that constitutes T1, i.e., excitation from HOMO to LUMO, i.e., the energy level difference between HOMO and LUMO. It is understood from this that anthracene and 9,10-diadamantylanthracene, which have a large energy level difference between HOMO−1 or HOMO−2 and HOMO or a large energy level difference between LUMO+1 or LUMO+2 and LUMO have a large T1–T2 gap while 9,10-diphenylaminoanthracene and 9,10-di(4-diphenylamino)phenolanthracene having a small energy level difference between these orbitals have a small T1–T2 gap.

If the energy gap between HOMO and HOMO−1 or LUMO and LUMO+1 is large, naturally the energy gap between HOMO and HOMO−2 and HOMO and HOMO−3 is also large. If the energy gap between LUMO and LUMO+1 is large, naturally LUMO and LUMO+2 and LUMO and LUMO+3 are also large.

If the energy difference between HOMO−1 and HOMO is 1.3 eV or more or the energy difference between LUMO and LUMO+1 is 1.3 eV or more, fundamentally, a T1–T2 energy gap of 1.3 eV or more is expectable in many cases.

Among the above-mentioned examples, the energy level difference between HOMO and HOMO−1 and the energy level difference between LUMO and LUMO+1 is less than 1.3 eV in 9,10-di(9,10-dimetylfluorenone)anthracene but T1–T2 gap of not less than 1.3 eV is attained. This is because T2 is constituted with excitation from HOMO−1 to LUMO+1 or from HOMO−2 to LUMO+2 and the energy level difference between HOMO and HOMO−1 and the energy level difference between LUMO and LUMO+1 are put together and both of them contribute thereto.

If the sum of the energy level difference between HOMO and HOMO−1 and the energy level difference between LUMO and LUMO+1 is 1.3 eV or more, T1–T2 gap of 1.3 eV or more may be expected.

The idea to focus attention on such energy levels of orbitals provides an effective way in designing the molecule that has a large T1–T2 since the energy levels of orbitals can be relatively easily considered in connection with the molecular structure.

When an atom in which the π conjugate system of a direct substituent has some population is bonded to an atom in which the n conjugate system of the central backbone has some population, an orbital is newly generated by the resonance of the central backbone and a substituent at an energy level considerably different from those of the orbitals of the central backbone and the substituent and replaces the original orbitals. An excited state that includes this newly generated orbital as an excitation orbital is newly made and this newly made excited state may become a new T1, T2 or S1 in many cases. If an orbital close to HOMO in energy level such as HOMO or HOMO−1 are newly generated, T1, T2 and S1 will be affected in many cases. In the case that the orbital splitting proceeds halfway at this time, the gap between HOMO and HOMO−1 will become small, and T1–T2 will drop.

7-3-2) In the case that the molecular HOMO and orbital HOMO−n below HOMO are considered to be generated from the resonance of HOMO of the non-substituted central backbone and an orbital of a substituent and molecular T1 and T2 are constituted by the excitations including HOMO and HOMO−n, it is desirable to have a large energy gap between HOMO and HOMO−n in order to attain a large T1–T2 gap. In order to enlarge the split of such HOMO and HOMO−n, it is desirable that HOMO of the non-substituted central backbone and HOMO of a substituent are in close energy levels and both the central backbone and the substituent have a large population in the atom to which the substituent is connected in the state before such a bonding is formed.

7-3-3) HOMO of the substituent is lower than HOMO−1 of the central backbone, and LUMO of the substituent is higher than LUMO+1 of the central backbone.

7-3-4) An atom that has population in HOMO of the central backbone and does not in HOMO−1 is substituted with an electron donor group.

7-3-5) An atom that has no population in HOMO but some in HOMO−1 of the central backbone is substituted with an electron-attracting group.

7-3-6) An atom that has population in LUMO of the central backbone and does not in LUMO+1 is substituted with an electron-attracting group.

7-3-7) An atom that has no population in LUMO but some in LUMO +1 of the central backbone is substituted with an electron donor group.

It is possible to perform some interpretations in this way, and conversely it is possible to try the design of the combination of a desirable central backbone and a substituent using such an interpretation at a hint. It is necessary to confirm the viability of the design at the final stage by performing a calculation simulation on the whole molecule in which the central backbone and a bulky substituent are specifically combined or by actually synthesizing the molecule.

7-4) In order to increase the reverse intersystem crossing rate 7-4-1) When the heavy atom effect of a relatively heavy atom is to be utilized, an element of the third and fourth periods of the periodic table is mentioned in the first place. It is easy to incorporate especially an element of the 3rd period into a molecule relatively stably. If chlorine that belongs to the 3rd period exists, $k_{TS}$ will be accelerated by double digit as will be understood from Reference 4 or Table 1. Bromine of the 4th period accelerates $k_{TS}$ by triple digit. Elements of the 5th or more periods and metallic elements will be also effective since there is an example in which they are incorporated into an organic compound in such a form as a metal complex although they may be disadvantage in respect of the stability of a molecule and/or cost.

An example of the molecule that has isobenzothiophene as a central backbone to which sulfur belonging to the 3rd period of the periodic table is introduced as a heavy atom is shown below.

Formula 4

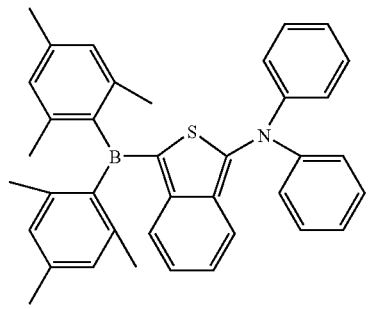

In addition, bis-isobenzothiophene or oligoisobenzothiophene that is a dimer or oligomer form of isobenzothiophene respectively may be used as a central backbone.

Sulfur is an atom having an atomic number 16 that is very close to chlorine (atomic number 17) disclosed in Reference 4. For this reason, the reverse intersystem crossing acceleration effect equivalent to chlorine is expectable. Moreover, isobenzbthiophene is a stable substance and is easy to synthesize.

7-4-2) When taking in El-Sayed's Rule, an element having a lone electron pair needs to exist in a molecule.

An example of the design using acridine as a central backbone will be illustrated.

The chemical structure of acridine is shown below.

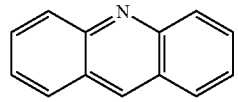

The following represents the main excitations that constitute each of the excited states. Acridine

| S1 | 3.4887 eV | HOMO→LUMO ($\pi\pi^*$) |
|----|-----------|------------------------|
| T1 | 1.9825 eV | HOMO→LUMO ($\pi\pi^*$) |
| T2 | 3.0407 eV | HOMO−1→LUMO ($n\pi^*$) |
| T3 | 3.4012 eV | HOMO−3→LUMO ($\pi\pi^*$) |

Each of the orbitals HOMO, LUMO and LUMO−3 is present in $\pi$ orbital or $\pi^*$ orbital which spreads over the whole molecule. HOMO−1 has a different nature from these and S1 at the 10-position is a $\pi\pi^*$ excitation where $\pi$ electron in the $\pi$ orbital spreading over the whole molecule is excited to $\pi^*$ orbital also spreading over the whole molecule while T2 is an $n\pi^*$ excitation where a lone pair in a lone orbital localized on nitrogen at the 10-position is excited to $\pi^*$ orbital spreading over the whole molecule.

However, the energy level of T2 is unfortunately lower than S1 and will not cause reverse intersystem crossing as it is.

Accordingly, it is contemplated whether the energy level of T2 could be raised above S1 by incorporating a suitable substituent on a suitable moiety to change the orbital energy level.

Figure 4:
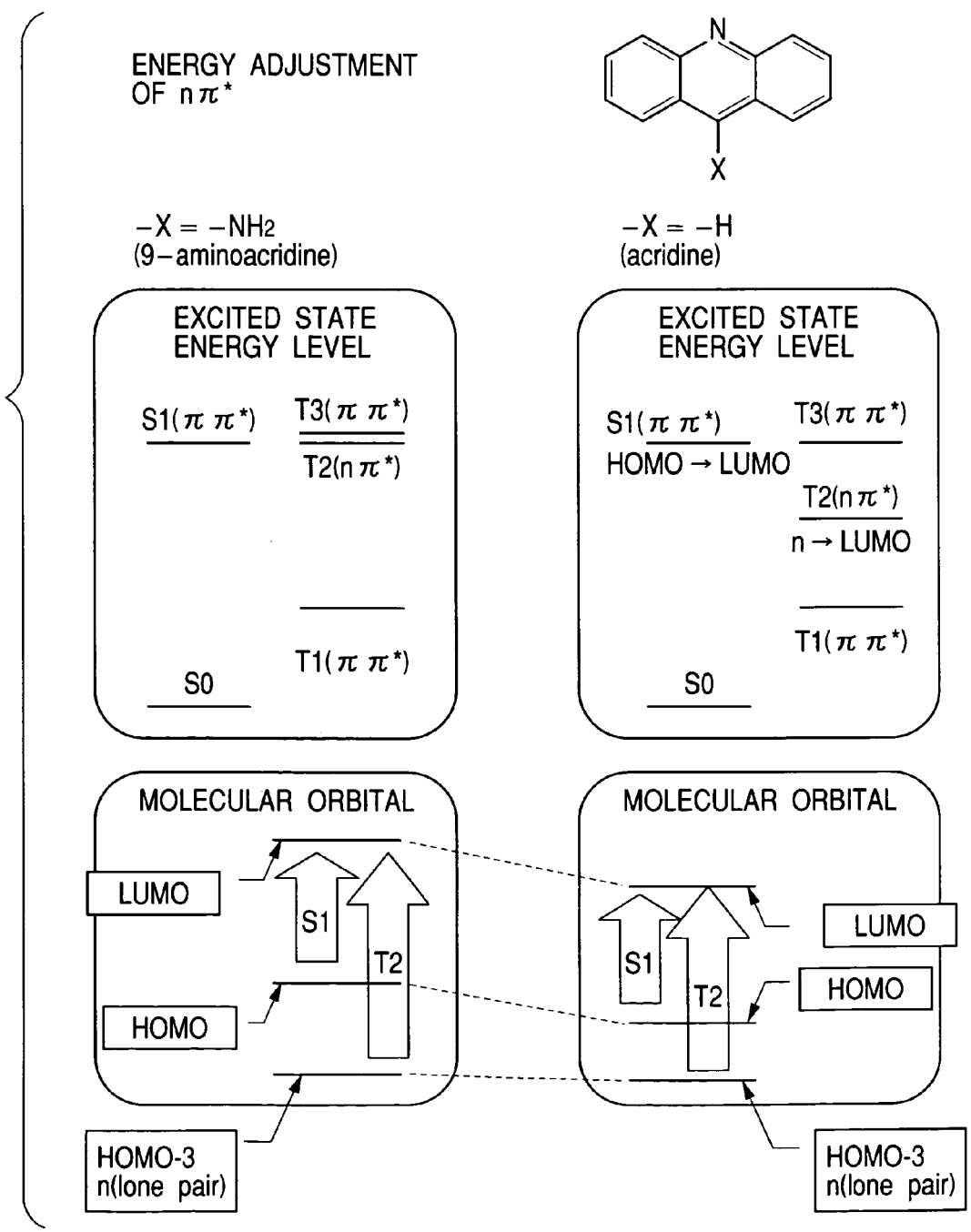
FIG. 4 illustrates an example of an attempt to introduce a suitable substituent into acridine to raise the energy level of T2 above S1.

FIG. 4 shows an example of such an attempt.

In 9-aminoacridine in which the 9-position of acridine is substituted with an amino group, energy levels of orbitals HOMO, LUMO and HOMO−3 respectively having population on a carbon atom directly bonded to the 9-position are raised under the effect of the amino group that is an electron donor group. HOMO−1 orbital which is mainly composed of an lone orbital localized on the nitrogen at the 10-position and has little population on the carbon atom directly bonded to the 9-position is not significantly influenced by the amino group, and the energy level thereof does not change. This enabled to raise the energy level of T2 which is excitation to LUMO from HOMO−1 while keeping S1, T1 and T3 substantially unchanged which are made of the excitation from HOMO to LUMO or HOMO−3 to LUMO.

9-aminoacridine

| S1 | 3.3281 eV | HOMO→LUMO ($\pi\pi^*$) |
|----|-----------|------------------------|
| T1 | 1.9473 eV | HOMO→LUMO ($\pi\pi^*$) |
| T2 | 3.3945 eV | HOMO−1→LUMO ($n\pi^*$) |
| T3 | 3.4420 eV | HOMO−3→LUMO ($\pi\pi^*$) |

Steric hindrance is also provided considering the above-described point.

In order to enable such a molecular designing, an element that may have a lone electron pair must be contained in a molecule in the first position. Elements of Groups V and VI of the periodic table are suitable as such an element. Particularly, suitable are N, O, P, S, etc. More particularly, N is desirable since the lone electron pair thereof has a relatively high energy level, and the energy level of triplet excited state by the excitation from there to LUMO, LUMO+1, etc. is close to the energy level of S1 in many cases.

It is also known that an aromatic carbonyl molecule wherein the carbonyl group and $\pi$ bond are conjugated will readily effect reverse intersystem crossing.

Whether an element has a lone electron pair or not depends on the character of the element itself and the type of the bonding with which the element exist in a molecule.

For example, even if N exists in a molecule, there is a case like triphenylamine wherein all of the three sp2 orbitals of N are used for bonding to other groups or elements (three phenyl groups in the case of triphenylamine) and remaining two outer-shell electrons enter in p orbital of the phenyl group and the electrons of this p orbital are conjugated with p orbital of the bonded phenyl groups to form $\pi$ electrons and nothing corresponds to lone electron pair.

On the other hand, when N exists in a hetero ring like acridine, two of the three sp2 orbitals of N are used for a bonding to the adjacent carbon atom and p orbital is used for $\pi$ bond, and remaining two outer-shell electrons enter in one sp2 orbital as a lone electron pair. Thus the lone electron pair exists in this case.

Thus, an element that may have a lone electron pair must be contained in the molecule.

Moreover, they must exist in a molecule in the state of a suitable bonding state.

7-5) Oscillator Strength 7-5-1) As stated in section 7-2-1) "Whole molecule composition", supposing that the excitation which constitutes the lowest excited singlet state responsible for luminescence is made of the excitation from HOMO which has main population on a central backbone to LUMO which has main population on a central backbone, oscillator strength will depend on the oscillator strength of the central backbone itself first. When HOMO and LUMO of the central backbone have the same symmetry, oscillator strength generally becomes remarkably small. It is desirable to avoid such a central backbone, or to cause HOMO or LUMO to have some population on the substituent by the aid of a substituent thereby and to break the symmetry of HOMO and LUMO on the central backbone by the effect of the substituent.

7-6) Carrier Accepting Properties

In order to make use of the effect of reverse intersystem crossing in an OLED device and to break through the conventional limit, a mechanism is required in which the molecule which effects reverse intersystem crossing directly trap the carrier and transits to an excited state, and emits light through relaxation or reverse intersystem crossing from there.

In order that a molecule directly trap the carrier, the molecule itself should have carrier accepting properties to accept any of an electron and an hole.

In this viewpoint, a substituent, especially a bulky substituent has desirably a structure containing a double bond portion at least in part thereof like phenyl group, aryl group such as condensed ring group, heterocyclic ring group, vinyl group or the like rather than a mere alkyl chain or mere alicyclic compound such as adamantane containing no $\pi$ conjugate systems.

7—7) External Quantum Efficiency

External quantum efficiency may be determined using a method by measuring all the radiation flux from the organic light emitting device using an integrating sphere and converting the result into the number of photons with the coefficient computed from the luminescence spectrum, and dividing the resulted number by the number of injected electrons computed from the injected current, and there is also a method by calculating from the value obtained with a luminance meter without using an integrating sphere. (Reference 6: Tsutsui T., Yamamato K., "Evaluation of True Power Luminous Efficiency from Experimental Luminance Values", Jpn. J. Appl. Phys., Vol. 38 (1999), Part1, No. 5A, 15 May 1999 and pp 2799–2803). More conveniently, there is a method in which luminescence from the light-emitting part of the organic light emitting device is assumed as perfect diffused radiation and external quantum efficiency is estimated from the front luminance B measured with the luminance meter, luminescence part area S, conversion coefficient C from the light flux to the number of photons calculated from the luminescence spectrum, injected current I and an elementary electric charge e of an electron as external quantum efficiency $\eta = (B \cdot \pi S \cdot C)/(I/e)$ 7-8) Material Purity In the examples of this invention, it was effective to repeat sublimation refining after usual column refining. In fact, even though the materials could fundamentally effect reverse intersystem crossing, if it was not sufficiently purified and the purity thereof remains low, devices prepared with such a material used for an emissive layer was not able to give a high efficiency exceeding 5% of external quantum efficiency.

EXAMPLES

Hereafter, the present invention will be described more specifically by way of examples, but this invention is not limited to these.

The following is the first example of the present invention.

Example 1

Compound of Formula 4 that has an isobenzothiophene structure of Formula 3 as a central backbone was designed by computer simulation. The software used for the simulation and conditions are as described above.

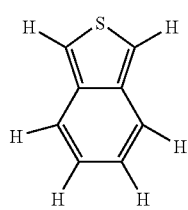

Formula 3

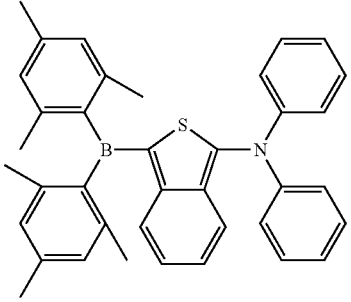

Formula 4

The energy level of each excited state was expected as follows.

| | |
|---|---|
| S1 | 2.6492 eV |
| T1 | 1.6129 eV |
| T2 | 2.9561 eV |
| S1 oscillator strength | 0.4318 |

T1–T2 gap is as large as 1.3432 eV, and is over 1.3 eV. T2>S1 is fulfilled and T2 is higher than S1 by 0.3069 eV. S1 oscillator strength has a sufficient value.

Substituents have a mesityl group and a phenyl group that are bonded to boron or nitrogen in the shape of a trident, respectively, and these mesityl and phenyl groups are further twisted around each other thereby realizing a bulky structure.

HOMO level is −4.9489 eV; and

LUMO level is −1.9431 eV and good charge injection properties can be expected by combining with an electron transporting layer by a suitable electron transporting material and a hole transporting layer by a suitable hole transporting material.

Synthesizing Method

The compound of the Formula 3 that constitutes a central backbone can obtained by the method as described by Reference 7 (Cava M. P., Pollack N. M., Mamer O. A., Mitchell M. J. "A simple synthetic route to benzo[c]thiophene and the naphtho[c]thiophenes" J. Org. Chem. 36 (1971) 25 pp. 3932–3937.

The compound represented by Formula 4 can be synthesized through the synthetic pathway shown below.

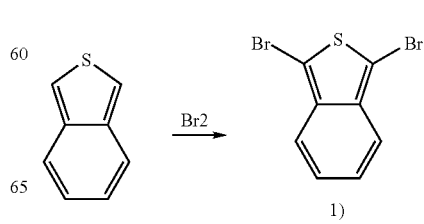

1)

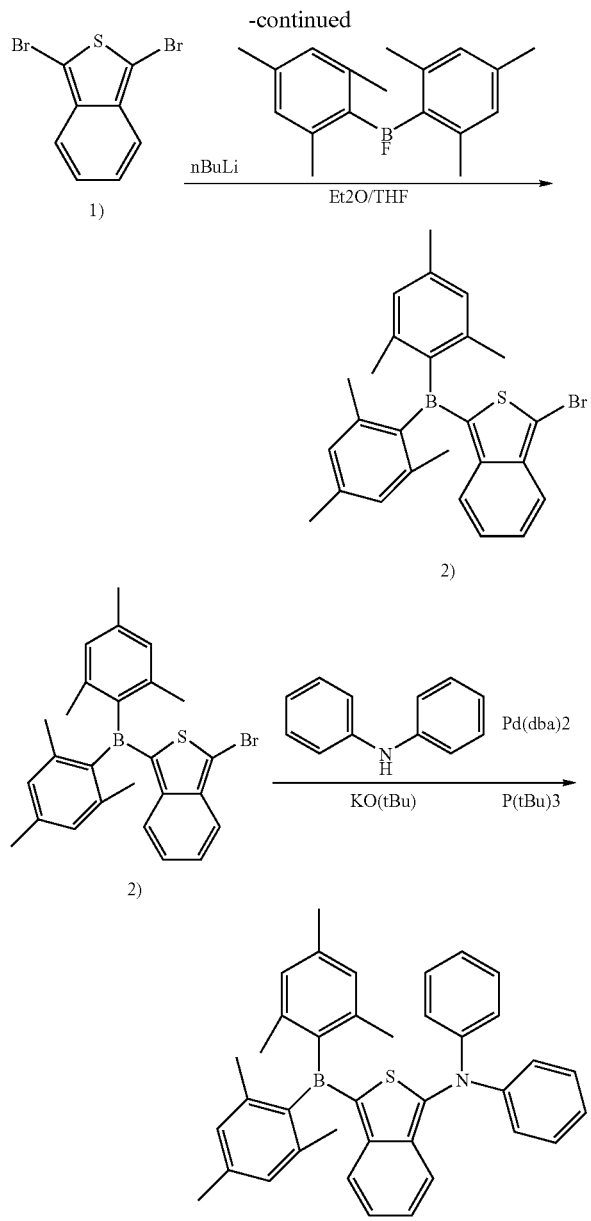

Evaluation

A toluene solution of the obtained compound (Formula 4) at a concentration of $1\times10^{-6}$ [mol/l] has an absorption at 400–500 nm, and it is expected to have fluorescent emission at 500–600 nm.

A thin film prepared by vacuum evaporation shows uniform film properties, and it is expected that significant nonuniformity such as crystallization at room temperature is not observed.

The absorption spectrum has an absorption at 400–500 nm, and the optical excitation spectrum is expected to have a fluorescent emission at 500-600 nm.

A fluorescence quantum yield in a thin film state of 60% or more is expected.

If an ethanol solution is cooled to liquid nitrogen temperature 77K and is excited with an infrared flash lamp and with infrared light at a wavelength of 950 nm, it is expected that a luminescence of the same wavelength as fluorescent emission originating from reverse intersystem crossing from T2 to S1 will be observed.

Further, it is expected that similar luminescence originating from reverse intersystem crossing will be observed in a thin film prepared by vacuum evaporation method.

Organic Light Emitting Device

A glass plate on which an indium tin oxide (ITO) film of 120 nm in thickness is formed by sputtering is used as a transparent conductive support substrate. This substrate is subjected to ultrasonic cleaning with acetone and isopropyl alcohol (IPA) subsequently, boiling cleaning with IPA and then dried. It is further subjected to UV/ozone cleaning and used as a transparent conductive support substrate.

First, the material of Formula 5 is used to prepare a 0.3 wt % chloroform solution.

Formula 5

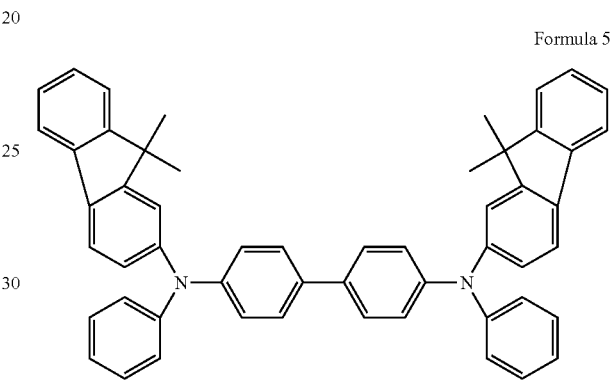

The chloroform solution is dropped on the glass substrate with ITO, and spin coating is performed first by rotation at 500 rpm for 10 seconds followed by rotation at 1000 rpm for 40 seconds. The thus formed layer serves as an hole injection/hole transporting layer of the device.

An emissive layer, an electron transporting layer, an electron injecting layer, and a cathode are formed in this order by vacuum evaporation on the spin coated glass substrate.

Under the background pressure of $5\times10^{-4}$ Pa in vacuum degree, the reverse intersystem crossing luminescent material of Formula 4 is stacked in a thickness of 200 Å to form an emissive layer. This emissive layer is a single emissive layer made of only the reverse intersystem crossing luminescent material of Formula 4.

Then, the electron transporting material represented by Formula 6 below is stacked in a thickness of 400 Å.

Formula 6

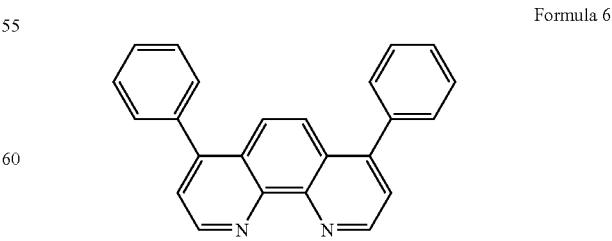

LiF is further stacked thereon in a thickness of 5 Å as an electron injecting layer. Furthermore, aluminum is stacked thereon in a thickness of 1000 Å as a cathode.

Figure 5:
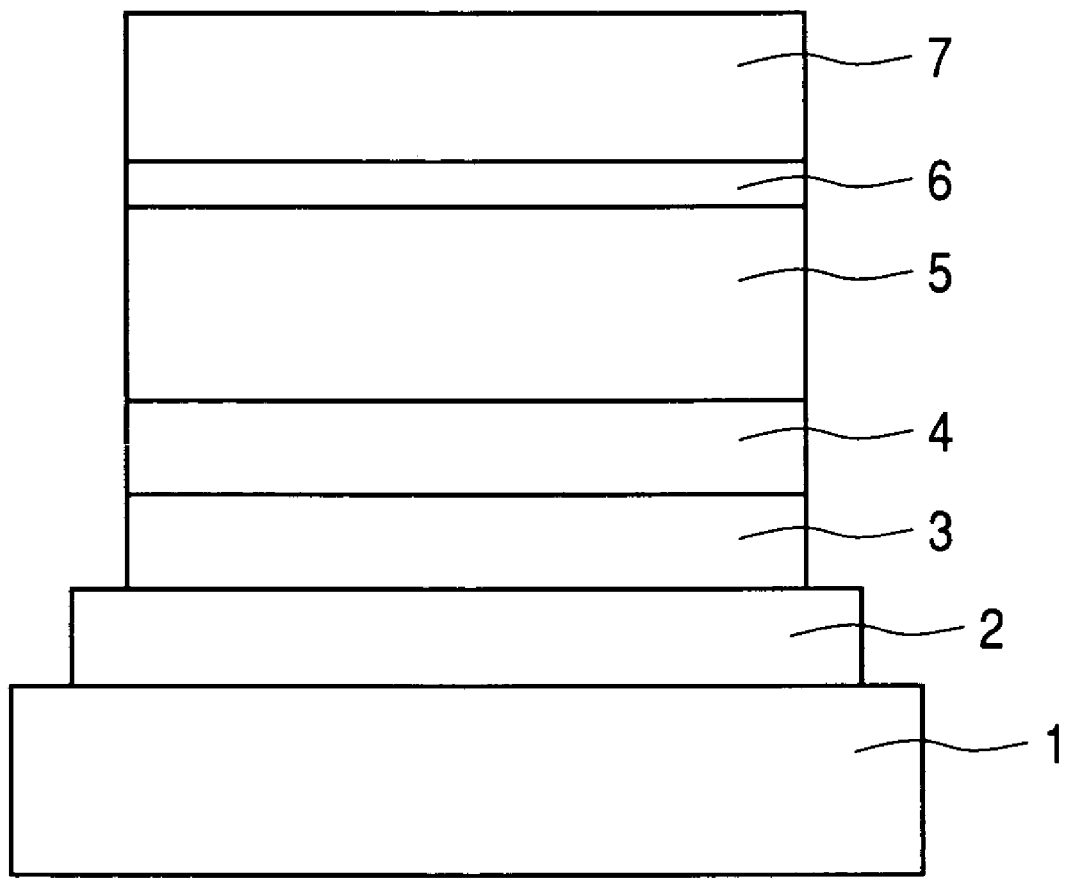
FIG. 5 illustrates the constitution of the organic light emitting device of an example of this invention.

Thus, a device having a structure shown in FIG. 5 is prepared.

To the thus obtained device is applied a DC voltage of 4 V at a current density of about 5 mA/cm² with the ITO electrode used as an anode and the Al electrode used as a cathode and it is expected that a green luminescence with an initial luminance of 1000 cd/m² or more will be observed. When this is converted into external quantum efficiency, it corresponds to 6% or more.

Example 2

A second example of this invention is described below.

The compound of the following Formula 8 was designed by computer simulation which had the benzothiazole represented by Formula 7 as a central backbone. The software and conditions used for the simulation are as stated above.

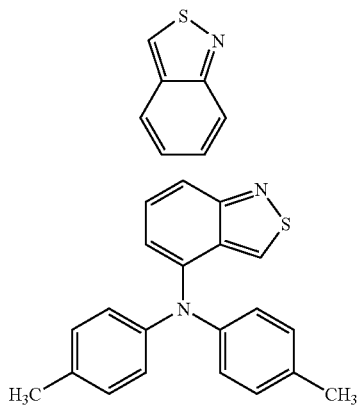

Formula 7

Formula 8

The energy level of each excited state was expected as follows.

| | |
|---|---|
| S1 | 2.7946 eV |
| T1 | 1.9273 eV |
| T2 | 2.9401 eV |
| S1 oscillator strength | 0.1190 |

Although T1–T2 gap is 1.0128 eV and does not exceed 1.3 eV, it is also large.
T2>S1 is fulfilled and T2 is higher than S1 by 0.1455 eV.
S1 oscillator strength has sufficient value.

The substituent has an amino group bonded to nitrogen to realize a bulky structure.
HOMO level is −4.9907 eV; and
LUMO level is −1.6861 eV, and good charge injection properties can be expected by combining with an electron transporting layer of a suitable electron transporting material, and a hole transporting layer of a suitable hole transporting material.

The above view was acquired.

Synthesizing Method 2,1-benzoisothiazole compound of Formula 8 can be synthesized by a commonly known method, and for example, an intermediate compound of 2,1-benzoisothiazole can be obtained by the method described in Advanced Heterocyclic. Chemistry. 38, 105–133 (1985). This bromide may be further reacted with ditolylamine using a palladium catalyst to obtain a compound of Formula 8.

Evaluation

A toluene solution of the obtained compound (Formula 8) at a concentration of 1×10⁻⁶ [mol/l] has an absorption peak at 415 nm and a fluorescent emission peak at 505 nm.

A thin film prepared by vacuum evaporation shows uniform film properties, and no significant nonuniformity such as crystallization at room temperature is observed.

Organic Light Emitting Device

A glass plate on which an indium tin oxide (ITO) film of a thickness of 120 nm is formed by sputtering is used as a transparent conductive support substrate. This substrate is subjected to ultrasonic cleaning with acetone and isopropyl alcohol (IPA) subsequently, boils cleaning with IPA and then dried. It is further subjected to UV/ozone cleaning and used as a transparent conductive support substrate.

First, the material of Formula 5 is used to prepare a 0.3 wt % chloroform solution.

The chloroform solution is dropped on the glass substrate with ITO, and spin coating is performed first by rotation at 500 rpm for 10 seconds followed by rotation at 1000 rpm for 40 seconds. This layer serves as an hole injection and hole transporting layer of the device.

An emissive layer, an electron transporting layer, an electron injecting layer, and a cathode are formed in this order by vacuum evaporation on the spin coated glass substrate.

Furthermore, the compound of Formula 8 and a carbazole compound represented by the following general Formula (mixing ratio: 20:100) were deposited in a film thickness of 20 nm by vacuum evaporation to form the emissive layer.

The degree of vacuum during the vacuum evaporation was 1.0×10⁻⁴ Pa and the film was formed at a film-forming rate of 0.2–0.3 nm/sec.

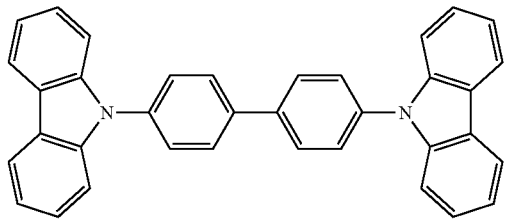

Then, the electron transporting material represented by Formula 6 is stacked in a thickness of 400 Å. LiF is further stacked thereon in a thickness of 5 Å as an electron injecting layer. Furthermore, aluminum is stacked thereon in a thickness of 1000 Å as the cathode.

Thus, a device having the structure shown in FIG. 5 is prepared.

Furthermore, the device was covered with a glass plate for protection in a nitrogen atmosphere and encapsulated with an acrylic resin based adhesive. To the thus obtained device was applied a DC voltage of 4 V with the ITO electrode used as an anode and the Al electrode used as a cathode, with the result that a green luminescence with a luminance of 10500 cd/m² was observed.

As described above with reference to embodiments and examples, according to the present invention, with an organic light emitting device comprising an anode, an organic layer and a cathode, wherein light-emitting molecules present in an emissive layer which is at least a part of the organic layer and responsible for luminescence by charge injection effect transition from a triplet excited state having an energy level higher than a lowest excited singlet state to a singlet excited state and effect fluorescent emission in a fluorescence quantum yield of 60% or more in the same state as existing in the emissive layer, and wherein the emissive layer comprises the light-emitting molecules as a main component in an amount of 50 wt % or more, or is doped with the light-emitting molecules at a high concentration of 7 wt % or more, or is a layer in which the light-emitting molecules are excitable by direct trapping of electrons and holes, it has become possible to break through the limit of 25% of internal quantum efficiency and 5% of external quantum efficiency while using singlet luminescence.

What is claimed is:

1. An organic light-emitting device comprising an anode, an organic layer and a cathode, wherein light-emitting molecules being present in an emissive layer, said emissive layer is at least a part of the organic layer and (a) provides luminescence by charge injection, (b) effects transition from a triplet excited state having an energy level higher than a lowest excited singlet state to the lowest singlet excited state, and (c) effects fluorescent emission in a fluorescence quantum yield of 60% or more in the same state as existing in the emissive layer, and wherein the light-emitting molecules in the emissive layer comprise a monomeric organic compound.

2. The organic light-emitting device according to claim 1, wherein the light-emitting molecules are 9,10-diadamantyl anthracene.

3. The organic light-emitting device according to claim 1, wherein the light-emitting molecules are 9,10-di(9,10-dimethyl fluorenone anthracene.

4. The organic light-emitting device according to claim 1, wherein the light-emitting molecules are a compound represented by the formula

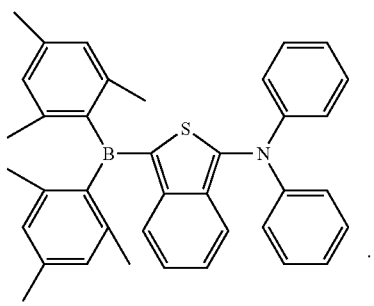

5. The organic light-emitting device according to claim 1, wherein the light-emitting molecules are a compound having a central unit with a resonance diene structure or anthracene structure responsible for luminescence, said central unit substituted by a bulky substituents providing steric hindrance.

6. The organic light-emitting device according to claim 5, wherein the central unit is isobenzothiophene or anthracene.

7. The organic light-emitting device according to claim 1, wherein the light-emitting molecules are a compound represented by the following general Formulas I or II

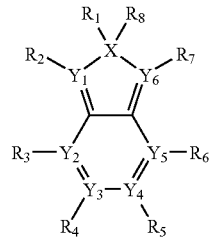

General Formula I wherein $Y_1$, $Y_2$, $Y_3$, $Y_4$, $Y_5$ and $Y_6$ are each a carbon atom or a nitrogen atom; $R_1$ and $R_8$ are each an optional substituent; when $Y_1$–$Y_6$ are each a nitrogen atom, $R_2$–$R_7$ are not present; when $Y_1$–$Y_6$ are each a carbon atom, $R_2$–$R_7$ are each a substituent; $R_1$–$R_8$ are the same or different or can be bonded together to form a ring; and X represents an atom of Group III, IV, V or VI of the Periodic Table

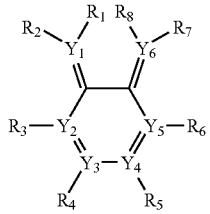

General Formula II wherein $Y_1$, $Y_2$, $Y_3$, $Y_4$, $Y_5$ and $Y_6$ each represent a carbon atom or a nitrogen atom; $R_1$ and $R_8$ are each an optional substituent; when $Y_1$–$Y_6$ are each a nitrogen atom, $R_2$–$R_7$ are not present; when $Y_1$–$Y_6$ are each a carbon atom, $R_2$–$R_7$ are each a substituent, and $R_1$–$R_8$ are the same or different or can be bonded together to form a ring.

* * * * *